United States Patent
Lee et al.

(10) Patent No.: US 11,173,988 B2
(45) Date of Patent: Nov. 16, 2021

(54) WATER FLOATING-TYPE SOLAR PHOTOVOLTAIC POWER GENERATOR

(71) Applicant: BK ENERGY CO., LTD., Yeosu-si (KR)

(72) Inventors: Heang Woo Lee, Yeosu-si (KR); Byeong Woo Lee, Yeosu-si (KR); Jae Sang Lee, Yeosu-si (KR); Jae An Lee, Yeosu-si (KR); Do Hyun Lee, Yeosu-si (KR); Si Hyun Lee, Goheung-gun (KR); Chang Jo Lee, Yeosu-si (KR); Ju Hee Lee, Yeosu-si (KR)

(73) Assignee: BK ENERGY CO., LTD., Yeosu-si (KR)

( * ) Notice: Subject to any disclaimer, the term of this patent is extended or adjusted under 35 U.S.C. 154(b) by 71 days.

(21) Appl. No.: 15/541,340

(22) PCT Filed: Dec. 29, 2015

(86) PCT No.: PCT/KR2015/014379
§ 371 (c)(1),
(2) Date: Jun. 30, 2017

(87) PCT Pub. No.: WO2016/108561
PCT Pub. Date: Jul. 7, 2016

(65) Prior Publication Data
US 2018/0015989 A1    Jan. 18, 2018

(30) Foreign Application Priority Data

Dec. 30, 2014    (KR) .................... 10-2014-0194134

(51) Int. Cl.
*F24S 20/70* (2018.01)
*B63B 21/50* (2006.01)
(Continued)

(52) U.S. Cl.
CPC .............. *B63B 35/44* (2013.01); *B63B 21/50* (2013.01); *F24S 20/70* (2018.05); *F24S 30/425* (2018.05);
(Continued)

(58) Field of Classification Search
None
See application file for complete search history.

(56) References Cited

U.S. PATENT DOCUMENTS 5,020,919 A * 6/1991 Suomi .................... G01K 17/20
374/156
2011/0265873 A1   11/2011 Kim
2012/0305051 A1   12/2012 Kokotov et al.

FOREIGN PATENT DOCUMENTS

KR    10-0831382 B1    5/2008
KR    10-0944073 B1    2/2010
(Continued)

OTHER PUBLICATIONS

Machine Translation of KR 100831382, accessed Mar. 22, 2019 (Year: 2019).*
(Continued)

*Primary Examiner* — Shannon M Gardner
(74) *Attorney, Agent, or Firm* — Maschoff Brennan (57) ABSTRACT

The present invention relate to a water floating-type solar photovoltaic power generator, and more particularly, to a water floating-type solar photovoltaic power generator which is easy to be manufactured by using a plurality of annular floating bodies; is economical; and is further favorable to rotation, the plurality of annular floating bodies consisting of synthetic pipes and being arranged to form a concentric circle on the basis of a main pillar, as a floating source for supporting solar photovoltaic generation equipment on the water.

4 Claims, 9 Drawing Sheets

(51) Int. Cl.
  *F24S 30/425*  (2018.01)
  *H02S 20/32*  (2014.01)
  *H01L 31/042*  (2014.01)
  *H02S 20/30*  (2014.01)
  *B63B 35/44*  (2006.01)
  *B63B 21/20*  (2006.01)
  *F24S 30/00*  (2018.01)

(52) U.S. Cl.
  CPC ............ *H01L 31/042* (2013.01); *H02S 20/30* (2014.12); *H02S 20/32* (2014.12); *B63B 2021/206* (2013.01); *B63B 2035/4453* (2013.01); *F24S 2030/11* (2018.05)

(56)  References Cited

FOREIGN PATENT DOCUMENTS

| | | |
|---|---|---|
| KR | 10-2011-0049426 A | 5/2011 |
| KR | 10-1171000 B1 | 8/2012 |
| KR | 10-2013-0117306 A | 10/2013 |
| KR | 10-2014-0105107 A | 9/2014 |
| KR | 10-2014-0135312 A | 11/2014 |

OTHER PUBLICATIONS

Machine Translation of KR 20140105107, accessed Mar. 22, 2019 (Year: 2019).*

KR Notification of Reason for Refusal dated Nov. 18, 2015 as received in Application No. 10-2014-0194134 (English Translation).

KR Grant of Patent dated Feb. 29, 2016 as received in Application No. 10-2014-0194134 (English Translation).

* cited by examiner

WATER FLOATING-TYPE SOLAR PHOTOVOLTAIC POWER GENERATOR

TECHNICAL FIELD

Embodiments of the present invention relate to a water floating-type solar photovoltaic power generator, and more particularly, to a water floating-type solar photovoltaic power generator which is easy to be manufactured, economical, and favorable to be rotated by using a plurality of annular floating bodies concentrically arranged around a main pillar as floating source and consisting of pipes of synthetic resin materials to support solar photovoltaic power generation equipments on the water.

DESCRIPTION OF RELATED ART

Much research and developments have been made for eco-friendly power generation facilities that can obtain electricity by using environment-friendly energy while environmental pollution is being intensifying, and more particularly, there are conducted many researches to replace the electricity produced by conventional power generation facilities beyond the level of obtaining a small amount of electricity from solar power generation, wind power generation, geothermal power generation and so on.

In this regard, the solar photovoltaic power generation facilities have come into wide use in recent years. In order to supplement the electric energy obtained from the existing power generation means through the above-described solar photovoltaic power generation facilities, there is a drawback in that the solar photovoltaic power generation facilities must be installed on a large scale, and thus, there is a problem that a wide flat ground is required for this.

In order to solve this problem, there have been recently made much efforts and attempts to install such a solar photovoltaic power generation facility on the wide surface of water.

A water floating type solar photovoltaic power generation facility is installed with a predetermined thickness and in a large area. Such a large-scaled water-floating solar photovoltaic power generation facility, which is normally consisting of a plurality of solar cell modules arranged in an equal interval and installed on a water-floating body which is made to be floated on the water surface with a predetermined size by mutually connecting a plurality of floats by a support, is easy to be shaken by waves as in the case that all kinds of floats installed on the water surface are easily shaken. While the position and the angle of receiving the sunlight are important for the solar power generation facility, it is not easy to fix the position and the angle of receiving the sunlight on the water surface, and it is still difficult to cope with the water level change effectively. There are many problems to be still solved such as a complicated sunlight tracking equipment in such a water-floating solar photovoltaic power generation facility, and so on.

As the prior art, in Korean Patent Registration No. 10-1171000 (Publication date: Aug. 8, 2012) titled as Apparatus for tracking condensing sunlight of water floating type, the apparatus comprises a float object installed on a water surface; an upper structure formed in an inverted triangular shape at an upper end of the float object to form a space portion at a center thereof and having a rotation axis including a bearing at an upper end thereof; a solar module plate that condenses sunlight; a rotary plate in which the solar module plate is formed on an upper surface thereof and a center portion of a lower surface thereof is fixed to the upper end of the rotation axis to be rotated in a lateral direction; a roller guide formed in a space portion at the center of the upper structure and formed along a rotation radius around the rotation axis; a rotary pusher roller movably formed along the roller guide; each rotary pusher having one end fixed to both sides of the bottom surface of the rotary plate and the other end hinge-coupled to the rotary pusher roller; a motor formed on the float object; a rack pinion for converting the rotational motion of the motor into a linear motion; a driven pipe formed on the float object and coupled to the rack pinion to linearly move in the lateral direction; and a roller link having one end hinge-coupled to the driven pipe and the other end hinge-coupled to the rotary pusher roller to move the rotary pusher roller in rotation radius along the roller guide when the driven pipe moves horizontally.

In the above-mentioned structure, the means for rotating the solar module plate is installed on the upper structure. Accordingly, since the rotation axis including the bearing is provided on the upper structure in order to install a large scale of the solar module plate, much power is needed, thereby causing many expenses for management, and furthermore, low economic efficiency caused by its complicated facility structure is considered problematic.

As another prior art, in Korea Patent Publication No. 10-2013-0117306 (Publication date: Dec. 25, 2013) titled as Tracking Type floating PV System, the system comprises a fixed floating body having a predetermined size and floating on the water surface; a variable type support rope that fixes the fixed floating body in the state of being always tense even when the water level fluctuates; a rotating float body that is rotatable installed inside the fixed floating body and has a solar cell module mounted on a fixed frame on its upper side; a rotating means for rotating the rotating float body inside the fixed floating body; and a control unit for controlling for the rotating means to be rotated by a solar tracking sensor and a solar azimuth controller so that the solar tracking can be performed.

However, in the above-mentioned prior art, since the rotating float body is integrally formed as a large disk, it is not easy for manufacture, and it is costly and requires large amounts of energy for rotation because its lower portion side is entirely in contact with water and it takes much load on rotation.

SUMMARY

The present invention is directed to solve the problems of the conventional technology described as above, and embodiments of the present invention provide a water floating-type solar photovoltaic power generator which is easy to be manufactured, economical, and favorable to be rotated by using a plurality of annular floating bodies concentrically arranged around a main pillar as floating source and consisting of pipes of synthetic resin materials to support solar photovoltaic power generation equipments on the water.

Further, embodiments of the present invention provide a water floating-type solar photovoltaic power generator which is accurate to be operated and easy to be manufactured by rotating annular floating bodies by using wires and a winding drum, and which is also easy to be installed by providing air injection and water discharge structure in a main pillar to be movable up and down by a user's operation.

In accordance with an aspect of the present invention, there is provided a water floating-type solar photovoltaic power generator installed on the water which comprises a central pillar unit including a main pillar installed while being vertically protruded on the water; a central rotation member movable up and down along a height direction of the main pillar, and being supported by the main pillar so as to be movable around the main pillar; a plurality of annular floating bodies formed to be floated on the water surface and concentrically arranged around the main pillar; a base interconnecting the central rotation member and the plurality of annular floating bodies such that the central rotation member and the plurality of annular floating bodies are integrally movable up and down and rotatable and a space for solar photovoltaic power generation equipment is formed thereon; and the solar photovoltaic power generation equipments installed on the base and including solar cell panels, wherein the annular floating bodies are configured such that a plurality of pipes are made of synthetic resin materials and interconnected to form a singular closed curve.

Further, the plurality of annular floating bodies may be classified into a first group of floating bodies disposed at the center portion, and a second group of floating bodies disposed outside the first group of floating bodies, and the annular floating bodies belonging to the first group of floating bodies are configured such that the plurality of pipes having a linear shape are interconnected via an elbow connection pipe to form a polygonal shape, and the annular floating bodies belonging to the second group of floating bodies are configured such that the plurality of the pipes are interconnected in a state bent by an external force to form a circular shape.

Further, each of the pipes of the annular floating bodies may be formed in a hollow shape, and partition walls for sealing an internal space of the pipe may be inwardly formed at both ends of the connected pipes.

Further, the water floating-type solar photovoltaic power generator of the present invention may further include a rotation driving unit for rotating the central rotation member and the annular floating bodies around the main pillar; and a central controlling unit for controlling the operation of the rotation driving unit such that the solar cell panels track the sun in accordance with solar azimuth.

Further, the rotation driving unit may include a pair of wires each having one end connected to the opposite sides of the base or the annular floating bodies disposed at outmost side; and a winding drum disposed at outside of the base for winding or unwinding the other ends of a pair of the wires to be opposite from each other.

Further, the central pillar unit may further include a plurality of anchors provided at the lower bottom surface of the annular floating bodies, and a holding rope for connecting the plurality of anchors and the main pillar such that the position of the main pillar is fixed on the water.

Further, the main pillar may include an air pocket formed therein, a weight block having a predetermined weight positioned at the lower end thereof, and an inlet and an outlet to allow air or water to be injected into or discharged from the air pocket by a user' operation such that the main pillar is vertically movable in the water.

Further, the central pillar unit may further include a tension adjusting weight connected to the holding rope such that tension of the holding rope is maintained.

DETAILED DESCRIPTION OF THE EMBODIMENTS

The present invention will now be described more fully hereinafter with reference to the accompanying drawings, in which exemplary embodiments of the present invention are shown.

Figure 1:
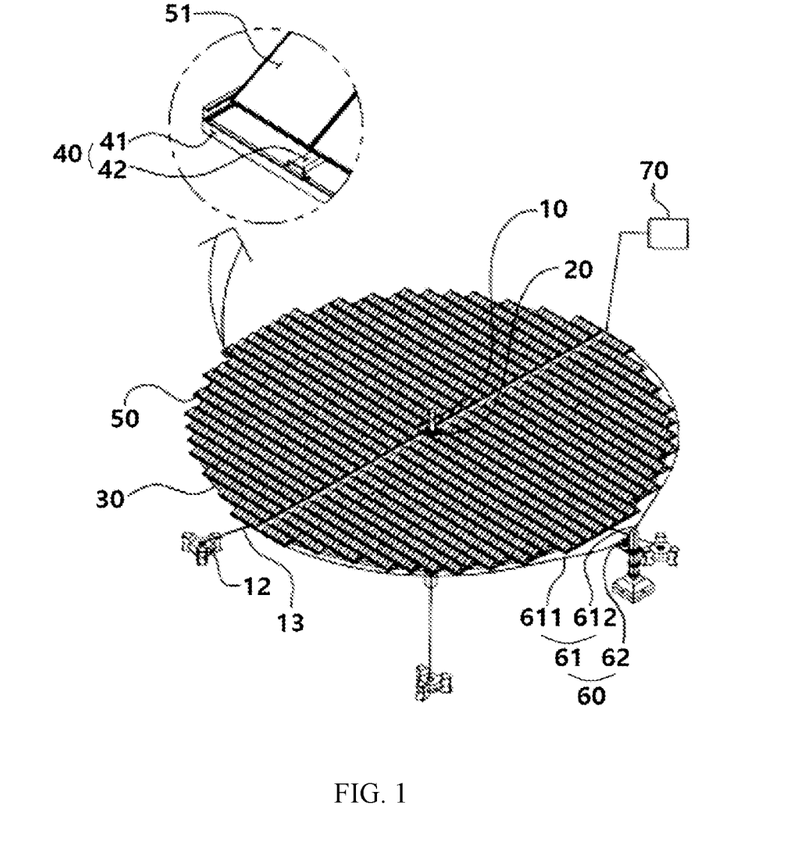
FIG. 1 is a perspective view of a water floating-type solar photovoltaic power generator in accordance with one embodiment of the present invention.
Figure 2:
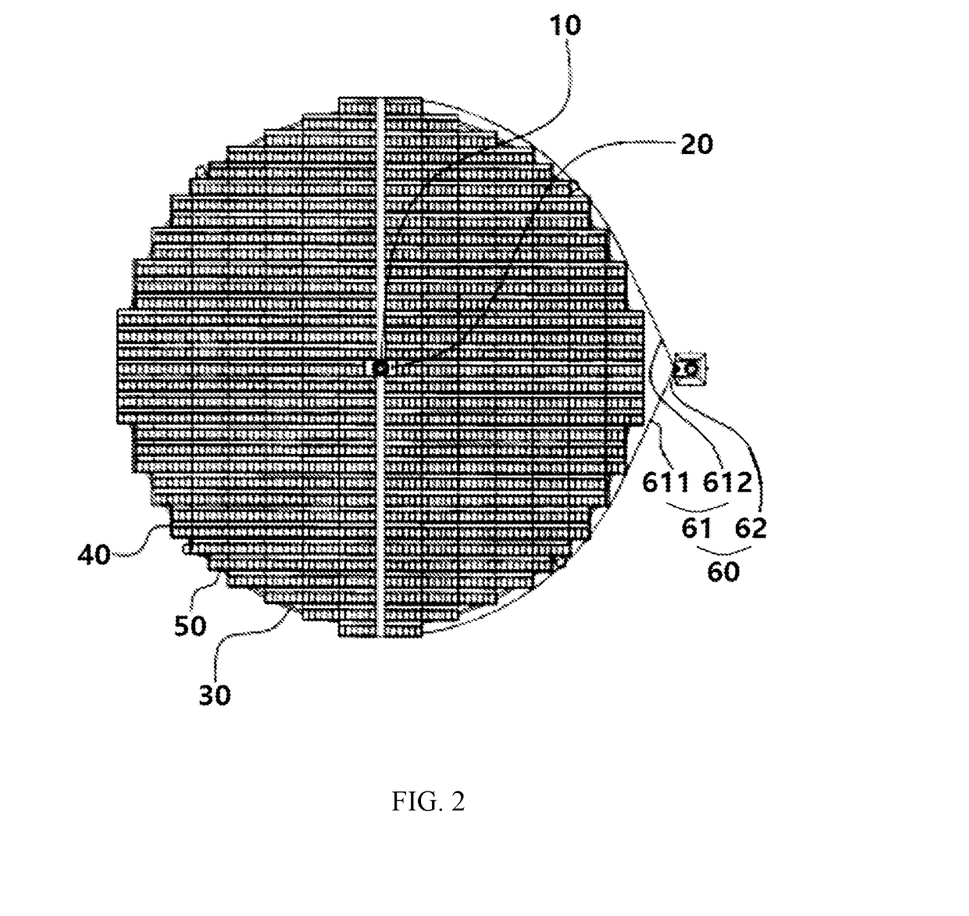
FIG. 2 is a plane view of a water floating-type solar photovoltaic power generator in accordance with one embodiment of the present invention.
Figure 3:
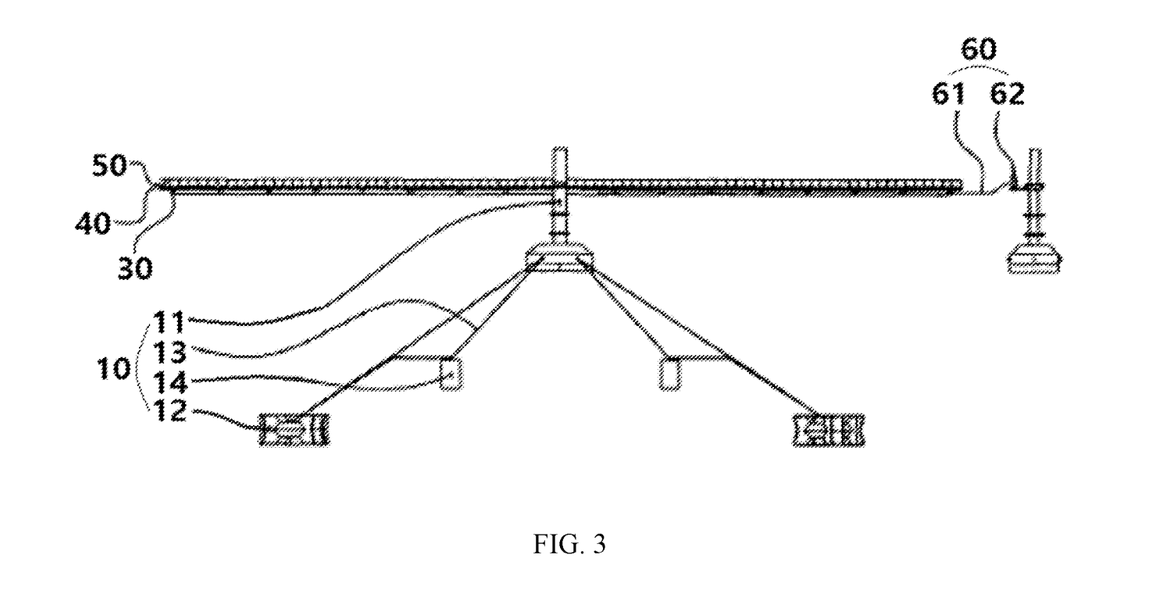
FIGS. 3 and 4 are side views of a water floating-type solar photovoltaic power generator in accordance with one embodiment of the present invention.
Figure 4:
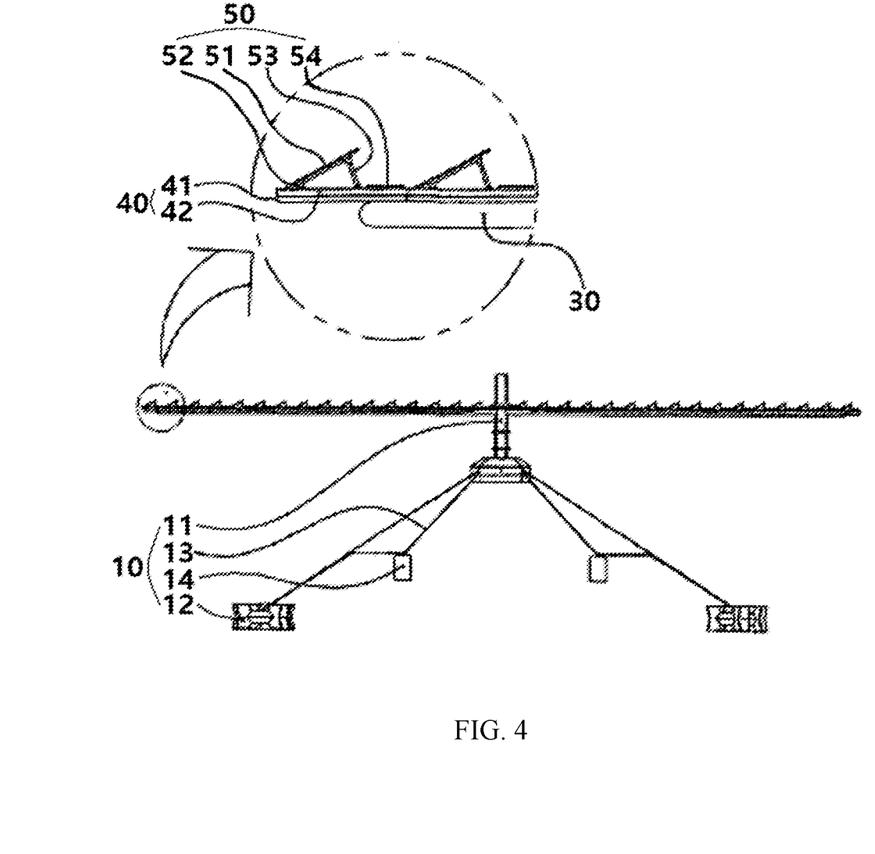
Figure 5:
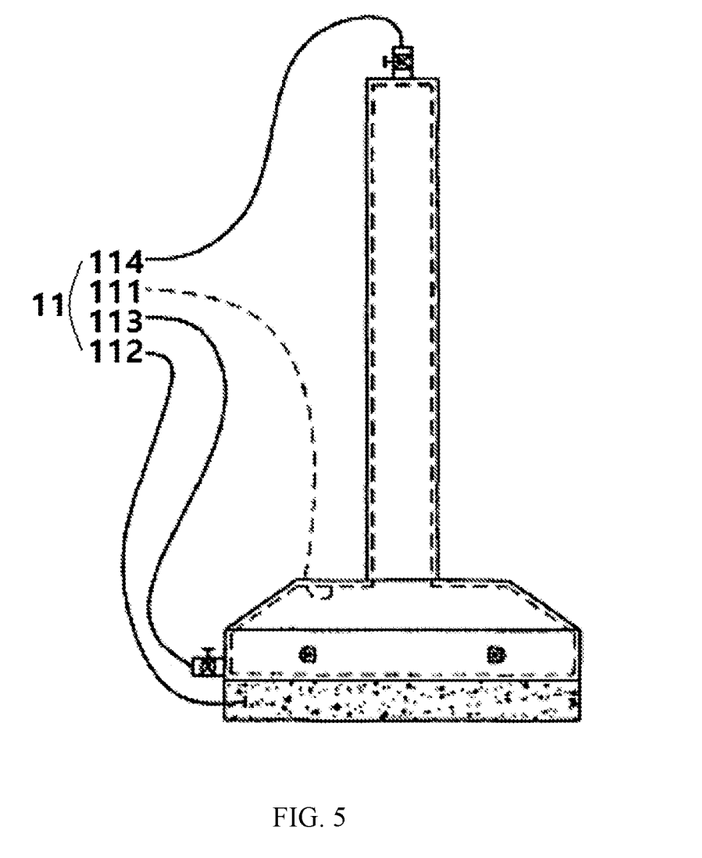
FIG. 5 is a side view of a main pillar in accordance with one embodiment of the present invention.
Figure 6:
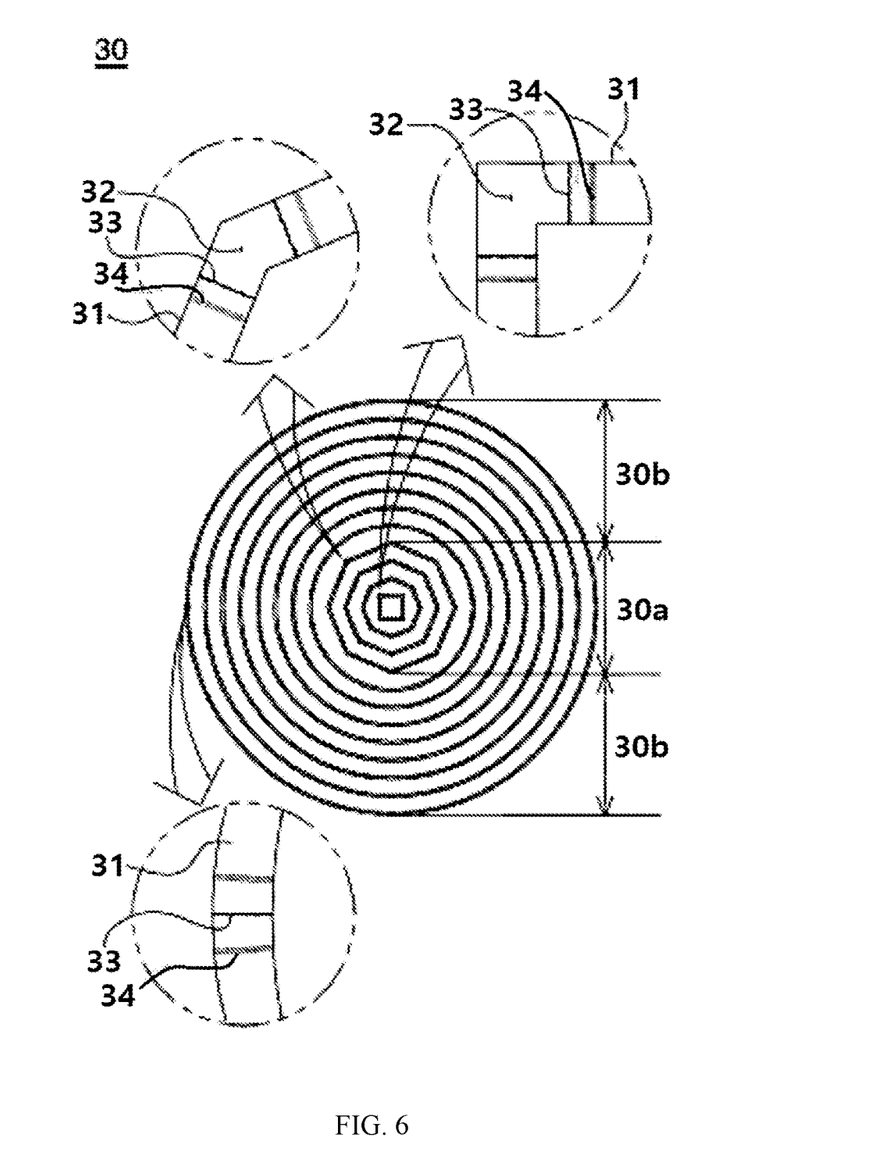
FIG. 6 is a plane view of annular floating bodies in accordance with one embodiment of the present invention.

FIG. 1 is a perspective view of a water floating-type solar photovoltaic power generator in accordance with one embodiment of the present invention, FIG. 2 is a plane view of a water floating-type solar photovoltaic power generator in accordance with one embodiment of the present invention, FIGS. 3 and 4 are side views of a water floating-type solar photovoltaic power generator in accordance with one embodiment of the present invention, FIG. 5 is a side view of a main pillar in accordance with one embodiment of the present invention, and FIG. 6 is a plane view of annular floating bodies in accordance with one embodiment of the present invention.

Referring to FIGS. 1 to 6, a water floating-type solar photovoltaic power generator 1 in accordance with one embodiment of the present invention includes a central pillar unit 10, a central rotation member 20, an annular floating body 30, a base 40, a solar photovoltaic power generation equipment 50, a rotation driving unit 60, and a central controlling unit 70.

The central pillar unit 10 functions as central axis of the water floating-type solar photovoltaic power generator of the present invention, and includes a main pillar 11, an anchor 12, a holding rope 13, and a tension adjusting weight 14.

As shown in FIG. 5, the main pillar 11 is formed such that it is vertically protruded on the water and further is configured such that an air pocket 111 is formed therein, a weight block 112 with a predetermined weight is provided at its lower end to make the main pillar 11 maintain its balance, and an inlet 113 and an outlet 114 are provided to allow air or water to be injected into or discharged from the air pocket 111 by a user's operation such that in the semi-submersible state, in order to make the main pillar 11 being vertically movable on the water.

While the main pillar 11 is being vertically protruded over the water, it is difficult to fit the main pillar 11 into the center of the central rotation member 20 with which the annular floating body 30 and the base 40 are interconnected, and therefore, while the main pillar 11 is pressed to be submerged into the water, the central rotation member 20, the annular floating body 30, and the base 40 are made to be assembled. After finishing the assembling, the main pillar 11 is then made to be movable up over the water, and the main pillar 11 is inserted into the center of the central rotation member 20.

For the way of allowing the main pillar 11 to be submerged into the water, it can be done by injecting water into the air pocket 111 through the inlet 113 so as to fill the air pocket 111 with water. On the contrary, in order to make the main pillar 11 floated up, it can be done by injecting air into the air pocket 111 through the inlet 113 so as to allow the water filling the air pocket 111 to be discharged from the outlet 114 and thereby to make the air pocket 111 being in a hollow state.

Regarding the anchor 12, there are a plural of anchors 12 installed under the annular floating bodies 30 on the lower side thereof. In particular, when the annular floating bodies 30 are descending down as the level of the water is decreased, the upper surface of the anchor 12 comes to contact the lower surface of the annular floating body 30 against to each other and support to each other. Preferably, the installation of the anchors 12 should be directed to make the facing annular floating body 30 well balanced, and it is also preferable that habitats for various kinds of aquatic plants and fish spawn are formed inside the water where the facility is located.

That is, the water storage capacity of water reservoir or dam may be changed according to rainfall water volume and water usage amount, and furthermore, when being badly in need of rain in long drought, and the reservoir becomes dried, the annular floating bodies 30 cannot maintain their balancing state on the water and thus come down even to the bottom of the reservoir, resulting in damages and breakage of the solar photovoltaic power generation equipment 50. Therefore, the anchors 12 provide the effect of preventing the breakage of the solar photovoltaic power generation equipment 50 in advance and sufficiently, and also usually function to provide effect of artificial reef for fish.

The anchors 12 are preferably made of steel slag concrete which is more advantageous of making aquatic plants by accelerating photosynthesis of the aquatic plants in creating fish spawning ground and breeding ground.

As shown in FIGS. 3 and 4, the anchor 12 and the main pillar 11 are connected by the holding rope 13 so as to fix the position of the main pillar 11 on the water.

The holding rope 13 functions to fix the position of the main pillar 11 on the water by connecting the main pillar 11 and a plurality of the anchors 12 which are provided on the lower bottom surface of the main pillar 11.

The tension adjusting weight 14 is connected to the holding rope 13 such that the tension is maintained on the holding rope 13.

That is, the tension adjusting weight 14 prevents the holding rope 13 from being loosened in the case that the main pillar 11 sinks due to a decrease in the water level.

The central rotation member 20 is movable up and down along a height direction of the main pillar 11, and is supported by the main pillar 11 so as to be rotatable around the main pillar 11.

The annular floating body 30 is formed so to be floated on the water surface, and a plurality of the annular floating bodies 30 are arranged to concentrically around the main pillar 11.

By the configuration that the plurality of the annular floating bodies 30 are arranged concentrically, the contact area of the annular floating bodies 30 with the water surface is relatively smaller than that of a circular disk-shaped floating body so as to occur less load during rotation, and thus, the annular floating bodies 30 can be rotated with a small energy.

Further, in one embodiment of the present invention, a plurality of pipes 31 made of synthetic resin such as PE pipe are provided to be connected to each other by the method of butt welding of pipe ends and the like to form a singular closed curve since the annular floating bodies 30 are relatively great in size and thus to facilitate manufacturing easier.

In one embodiment of the present invention as shown in FIG. 6, the plurality of annular floating bodies 30 may be classified into a first group of floating bodies 30a displaced at a center portion and a second group of floating bodies 30b displaced outside the first group of floating bodies 30a.

The annular floating bodies 30 belonging to the first group of floating bodies 30a are configured such that the plurality of pipes 31 having a linear shape are interconnected through an elbow connection pipe 32 to form a polygonal shape.

That is, it is difficult to form closed curves by bending the pipe 31 in the first group of floating bodies 30a since the diameter of the annular floating body in the first of group floating bodies 30a is relatively smaller than that of the annular floating body in the second group of floating bodies 30b, and thus, the tool such as the elbow connection pipe 32 may be employed as intermediary for the connection to form closed curves.

In one embodiment of the present invention, the annular floating body 30 displaced at the center of the first group of floating bodies 30a is formed to be a rectangular shape to facilitate easy manufacturing, and the annular floating bodies 30 outside the annular floating body 30 displaced at the center as above are configured to form an octagonal shape.

Further, the annular floating bodies 30 belonging to the second group of floating bodies 30b are configured such that the plurality of pipes 31 are interconnected in a state bent by an external force to form a circular shape.

That is, as the annular floating bodies 30 belonging to the second group of floating bodies 30b are greater in diameter, it can be bent by the external force to some extent, and thus the pipes 31 can be directly connected to each other without use of intermediary component such as the elbow connection pipe 32 unlike the structure of the first group of floating bodies 30a.

Further, in one embodiment of the present invention, each of the pipes 31 of the annular floating bodies 30 is formed to be hollow, and a partition wall 34 for sealing the internal space of the pipe 31 is inwardly formed from a connector 33 which is each formed at both ends of the pipes 31.

Owing to the structure of the partition wall 34, the annular floating body 30 can keep its buoyancy even though the pipes 31 of the annular floating bodies 30 are partially damaged or water leakage occurs in the connector 33, so as to maintain its stability.

The base 40 is configured to connect the central rotation member 20 and the plurality of annular floating bodies 30, and owing to the base 40, the central rotation member 20 and the plurality of annular floating bodies 30 can be integrally movable up and down or rotated, and also the installation space for the solar photovoltaic power generation equipment can be provided thereon.

The base 40 is preferably structured such that a transverse frame 41 and a longitudinal frame 42 are displaced as grid pattern in order to minimize its weight while providing the installation space for the solar photovoltaic power generation equipment thereon.

The solar photovoltaic power generation equipment 50 is structured to convert solar energy to electric energy, and may include a solar cell panel 51, a panel connect hinge 52, a panel inclined support link 53, and a check board 54.

The solar cell panel 51 is formed to condense sun light.

Further, a sprinkler (not shown) may be installed in the solar cell panel 51, in order to sprinkle water to the solar cell panel and thereby to decrease the temperature and ultimately increase the productivity and efficiency of the solar photovoltaic power generation.

The panel connect hinge 52 is formed to connect the front end of the solar cell panel 51 to the base 40, and the panel inclined support link 53 is formed to connect the back end of the solar cell panel 51 and the base 40 in order to make the solar cell panel 51 be supported by the base 40 while maintaining a predetermined inclined angle.

The inclined angle of the solar cell panel 51 which is made by the panel inclined support link 53 is preferably around 27°.

The check board 54 is formed in the base 40 with a predetermined width for a user to be capable of moving and passing by in order to check and inspect the solar cell panels 51 and so on.

The rotation driving unit 60 is controlled by the central controlling part 70, and configured to rotate the central rotation member 20 and the annular floating bodies 30 around the main pillar 11. In one embodiment of the present invention, the rotation driving unit 60 may include a wire 61 and a winding drum 62.

The wire 61 may be formed of a pair of a first wire 611 and a second wire 612, which are respectively connected at their one ends to the opposite facing sides of the base 40 or the annular floating bodies 30 which are disposed at outmost side. Meantime, the other ends of the first wire 611 and the second wire 612 are connected to the winding drum 62.

The winding drum 62 is disposed at the outer one side of the base 40, and functions to wind or unwind the other ends of the pair of wires 61 toward the opposite from each other.

That is, when the winding drum 62 winds the first wire 611, it acts to unwind the second wire 612, and when the winding drum 62 unwinds the first wire 611, it acts to wind the second wire 612. Thereby, the rotation driving unit 60 according to one embodiment of the present invention is controlled by the central controlling unit 70, and can make the annular floating bodies 30 be rotated clockwise or counterclockwise in accordance with exact angle of solar azimuth, that is, predetermined time schedule.

The central controlling unit 70 functions to control the operation of the rotation driving unit 60 such that the solar cell panels 51 can track the sun in accordance with solar azimuth.

As described above, the water floating-type solar photovoltaic power generator according to one embodiment of the present invention has been described. Hereinafter, a water floating-type solar photovoltaic power generator according to a second, a third, and a fourth embodiment will be described in reference to FIGS. 7 to 9.

Figure 7:
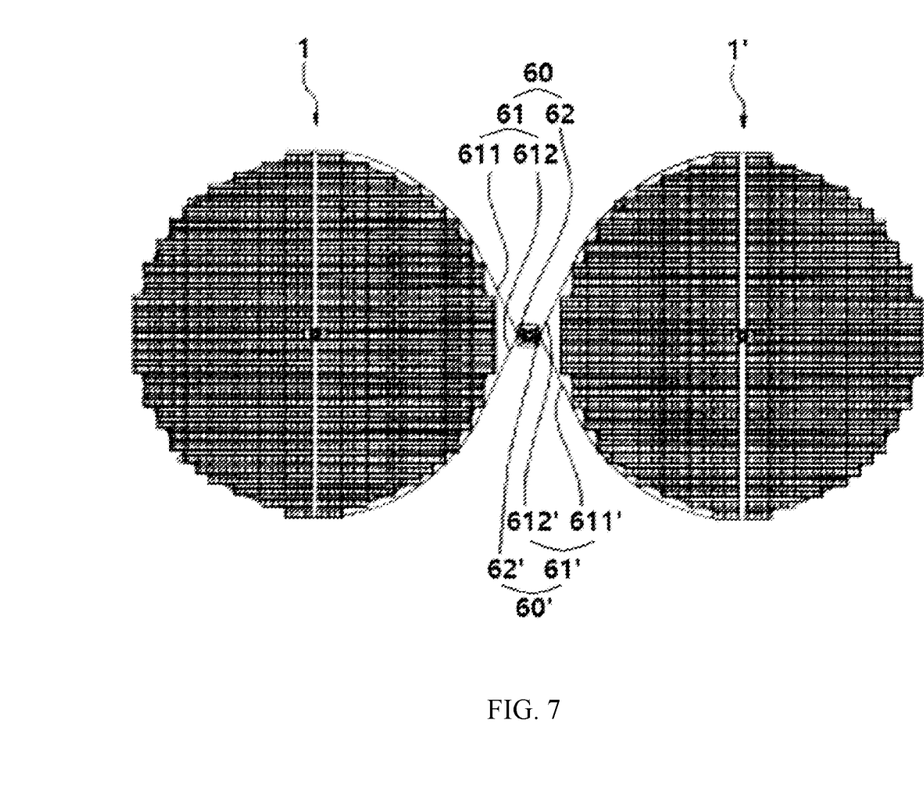
FIG. 7 is a plane view of a water floating-type solar photovoltaic power generator in accordance with a second embodiment of the present invention.
Figure 8:
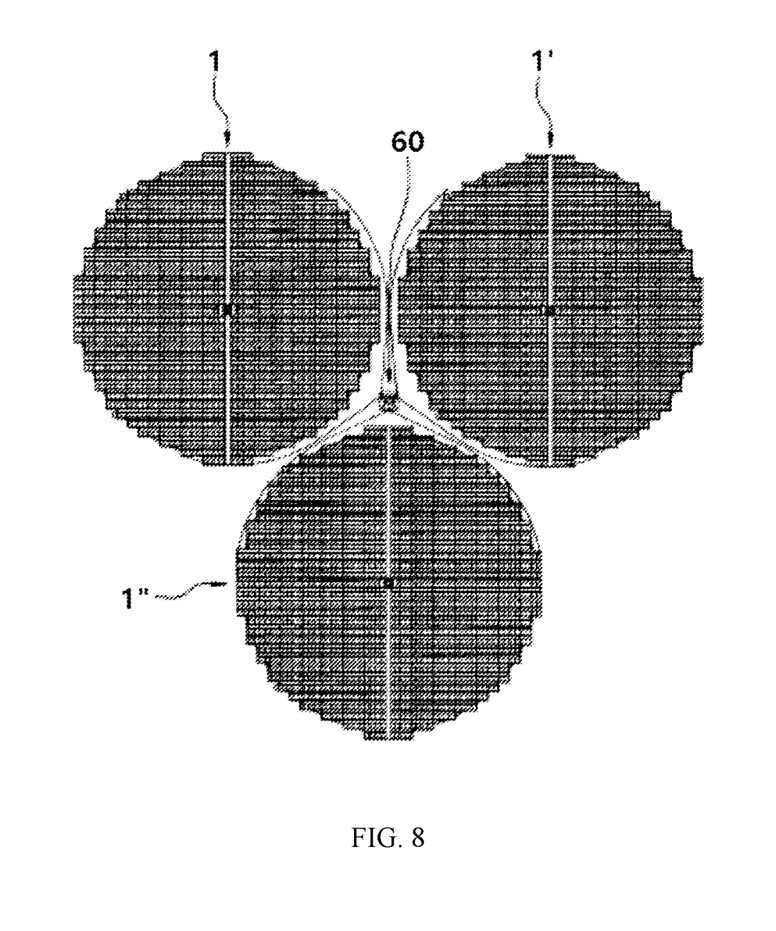
FIG. 8 is a plane view of a water floating-type solar photovoltaic power generator in accordance with a third embodiment of the present invention.
Figure 9:
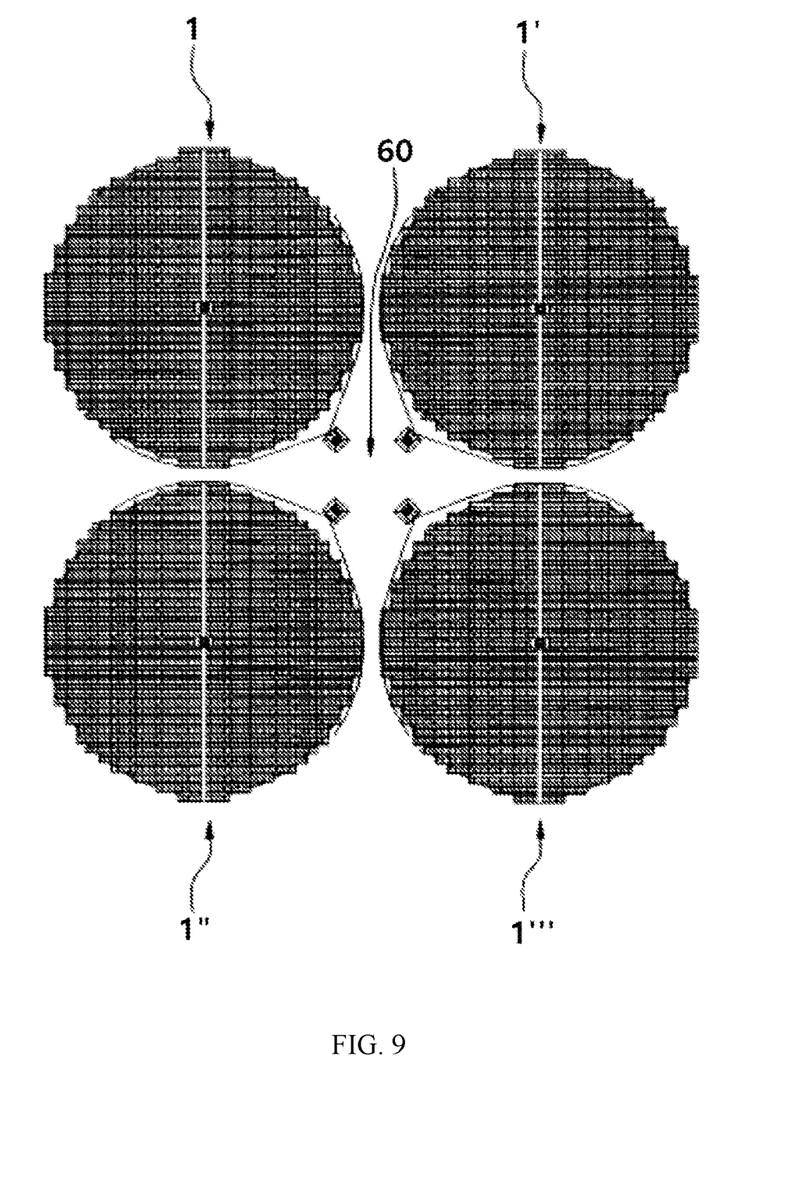
FIG. 9 is a plane view of a water floating-type solar photovoltaic power generator in accordance with a forth embodiment of the present invention.

The second embodiment of FIG. 7 shows the embodiment in that two water floating-type solar photovoltaic power generators (1 and 1') of the present invention are interlocked, a third embodiment of FIG. 8 shows the embodiment in that three water floating-type solar photovoltaic power generators (1, 1' and 1") of the present invention are interlocked, and a fourth embodiment of FIG. 9 shows the embodiment in that four water floating-type solar photovoltaic power generators (1, 1', 1" and 1'") of the present invention are interlocked.

That is, the water floating-type solar photovoltaic power generator according to the present invention may be installed on the water independently as in a first embodiment of the present invention as above, and a plurality of the water floating-type solar photovoltaic power generators may be installed to be interlocked as in a second to a fourth embodiment.

As described and illustrated as above with reference to the drawings, the water floating-type solar photovoltaic power generator according to the present invention is illustrative of one embodiment to show the present invention, and is not to be construed as limiting thereof. Although a few embodiments have been described, those skilled in the art will readily appreciate that many modifications are possible without materially departing from the novel teachings and advantages. Accordingly, all such modifications are intended to be included within the scope of this present invention as defined in the claims. In the claims, means-plus-function clauses are intended to cover the structures described herein as performing the recited function, and not only structural equivalents but also equivalent structures.

INDUSTRIAL APPLICABILITY

The water floating-type solar photovoltaic power generator according to the present invention as structured above is advantageous for easy manufacturing by the structure of the plurality of annular floating bodies consisting of the synthetic resin pipes and being arranged to form concentric circles and economical and furthermore, advantageous in rotation.

Further, the water floating-type solar photovoltaic power generator according to the present invention as structured above is advantageous in accurate operation and easy manufacturing by rotating the annular floating bodies by using the wires and the winding drum, and also advantageous in easy installation by providing the structure of air injection and water discharge in the main pillar so as to be movable up and down by a user's operation.

What is claimed is:
1. A solar photovoltaic power generator capable of floating on water, comprising:
   a central pillar unit including a main pillar configured to vertically protrude from the water;
   a central rotation member movable up and down along a height direction of the main pillar, and being supported by the main pillar so to be rotatable around the main pillar;
   a plurality of annular floating bodies formed to be floated on the water surface and concentrically arranged around the main pillar;
   a base interconnecting the central rotation member and the plurality of annular floating bodies such that the central rotation member and the plurality of annular floating bodies are capable of both up and down movement while simultaneously rotatable movement and a space for solar photovoltaic power generation equipments is formed thereon; and
   the solar photovoltaic power generation equipments are installed on the base and including solar cell panels,
   wherein the plurality of the annular floating bodies include a plurality of pipes which are made of synthetic resin materials and a plurality of connectors which are formed at both ends of the plurality of pipes, the plurality of pipes including a first group of pipes and a second group of pipes, wherein the plurality of annular floating bodies comprise a first group of floating bodies disposed at a center portion, elbow connection pipes and a second group of floating bodies disposed radially exterior to the first group of floating bodies, and the first group of floating bodies comprises the first group of pipes, the first group of pipes including a plurality of first pipes, each of the plurality of first pipes having a linear shape, the plurality of first pipes interconnected via the elbow connection pipes to form a plurality of polygonal shapes, and the second group of floating bodies comprises the second group of pipes, the second group of pipes including a plurality of a second pipes, the plurality of the second pipes being interconnected to form a plurality of circular shapes, wherein each of the first and second pipes of the plurality of annular floating bodies has partition walls for sealing an internal space of each of the first and second pipes which are inwardly formed at both ends of each of the first and second pipes, wherein the central pillar unit further includes a plurality of anchors provided at a lower bottom surface of the plurality of annular floating bodies, and a holding rope for connecting the plurality of anchors and the main pillar such that a position of the main pillar is fixed on the water, wherein the main pillar further includes an air pocket formed therein, a weight block with a predetermined weight at a lower end of the main pillar, and an inlet and an outlet to allow air or water to be injected into or discharged from the air pocket by a user's operation such that the main pillar being vertically movable in the water.

2. The water floating solar photovoltaic power generator of claim 1, further comprising a rotation driving unit for rotating the central rotation member and the plurality of annular floating bodies around the main pillar; and a central controlling unit for controlling the operation of the rotation driving unit such that the solar cell panels track the sun in accordance with solar azimuth.

3. The water floating solar photovoltaic power generator of claim 2, wherein the rotation driving unit includes a pair of wires each having one end connected to the opposite sides of the base or the plurality of annular floating bodies disposed on the outmost side of the base and the other end connected to a winding drum; and the winding drum is disposed at outside of the base to wind or unwind the other end of a pair of the wires to be opposite to each other.

4. The water floating solar photovoltaic power generator of claim 1, wherein the central pillar unit further includes a tension adjusting weight connected to the holding rope such that tension of the holding rope is maintained.

* * * * *